United States Patent
Gomez

Patent Number: 5,210,758
Date of Patent: May 11, 1993

[54] MEANS AND METHOD FOR DETECTING AND CORRECTING MICROINSTRUCTION ERRORS

[75] Inventor: Alejandro Gomez, Walnut, Calif.

[73] Assignee: Unisys Corporation, Blue Bell, Pa.

[21] Appl. No.: 816,791

[22] Filed: Jan. 3, 1992

Related U.S. Application Data

[63] Continuation of Ser. No. 205,989, Jun. 13, 1988.

[51] Int. Cl.$^5$ .............................................. G06F 11/00
[52] U.S. Cl. .................................... 371/16.1; 371/12; 371/13
[58] Field of Search ...................... 371/12, 13, 16.1, 18, 371/19, 10.2; 364/200 MS, 900 MS

[56] References Cited

U.S. PATENT DOCUMENTS

| | | | |
|---|---|---|---|
| 4,566,103 | 1/1986 | Sato | 371/12 |
| 4,641,305 | 2/1987 | Joyce | 371/13 X |
| 4,694,454 | 9/1987 | Matsuura | 371/13 |
| 4,701,915 | 10/1987 | Kitamura | 371/16 X |
| 4,800,563 | 1/1989 | Itagaki | 371/13 |
| 4,823,307 | 4/1989 | Melgara | 371/16 X |

*Primary Examiner*—Robert W. Beausoliel, Jr.
*Assistant Examiner*—Ly V. Hua
*Attorney, Agent, or Firm*—Nathan Cass; Mark T. Starr

[57] ABSTRACT

A microinstruction error is detected in a microprogrammed digital data processor by providing for checking the presence of an error in an accessed microinstruction concurrently with the application of the accessed microinstruction to the microprocessor execution unit. If a microinstruction error is detected, microinstruction execution is aborted and a maintenance processor provides a correct microinstruction, following which operations are restarted. Provision is also made for detecting whether the error is a hard error and, if so, for substituting a spare microinstruction memory for the memory portion which caused the hard error.

10 Claims, 2 Drawing Sheets

MEANS AND METHOD FOR DETECTING AND CORRECTING MICROINSTRUCTION ERRORS

This application is a continuation of patent application Ser. No. 07/205,989, filed Jun. 13, 1988 now abandoned.

BACKGROUND OF THE INVENTION

This invention relates generally to microprogrammed digital data processors, and more particularly to improved means and methods for handling a microinstruction error.

One of the more serious types of errors that can occur in a microprogrammed data processor is an error occurring in a microinstruction accessed from a microinstruction memory, since such an error could lead to the corruption of data in a manner which would be most difficult, if not impossible, to recover from. It is thus of considerable importance that provision be made for handling a microinstruction error if it should occur.

OBJECTS AND SUMMARY OF THE INVENTION

Accordingly it is a primary object of the invention to provide for handling a microinstruction error without slowing up normal microinstruction flow when no microinstruction error is present.

Another object of the invention is to provide a method for handling a microinstruction error in an economical and reliable manner.

A further object of the invention is to provide improved means and methods for handling both soft (transient) and hard errors.

A still further object of the invention in accordance with one or more of the foregoing objects is to provide improved means and methods for correcting as well as detecting the occurrence of a microinstruction error.

Yet another object of the invention in accordance with one or more of the foregoing objects is to provide for the substitution of appropriate alternate hardware in response to the detection of a hard error.

The above objects are accomplished in a particular preferred embodiment of the invention by providing for microinstruction error checking in a manner which does not delay normal microinstruction processing when no error is present, but which, in response to a detected microinstruction error, "freezes" operations (to prevent data corruption) while signaling a maintenance processor to provide for correction of the error followed by "unfreezing" of operations to continue normal microinstruction operations using the corrected microinstruction. The maintenance processor also provides for detecting the occurrence of a hard error and for substituting appropriate alternate hardware to prevent a reoccurrence of the error.

The specific nature of the invention as well as other objects, features advantages and uses thereof will become evident from the following detailed description taken in conjunction with the accompanying drawings.

DETAILED DESCRIPTION OF THE INVENTION

Like numerals and characters represent like elements throughout the figures of the drawings.

Figure 1:
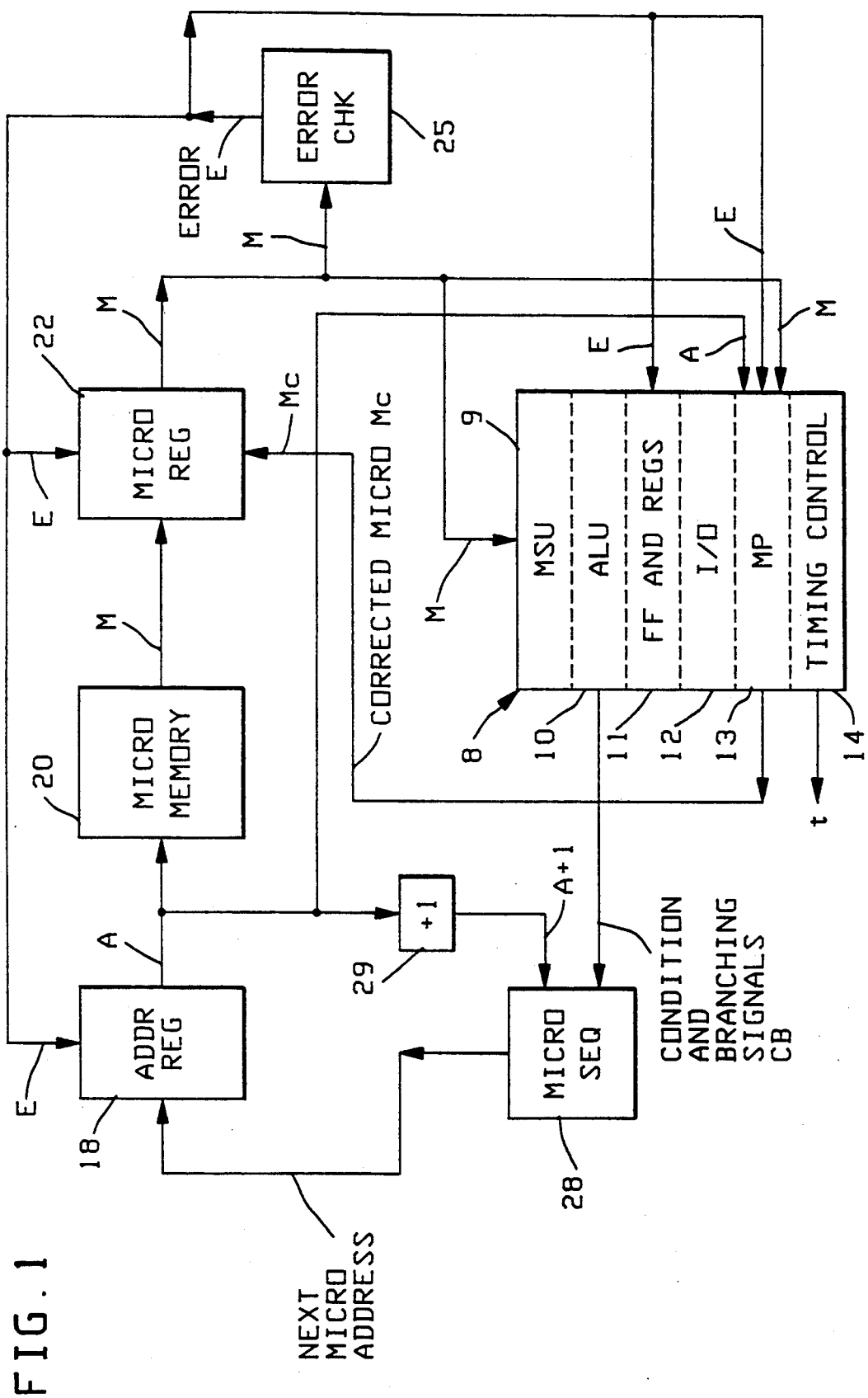
FIG. 1 is an electrical block diagram illustrating a preferred embodiment of the invention.

Reference is initially directed to FIG. 1 which illustrates a digital data processing system employing microprogramming control means in accordance with the invention. For the sake of simplicity, block 8 in FIG. 1 represents conventional portions of a digital data processing system which may be employed in conjunction with the exemplary embodiment of the present invention illustrated in the remaining portions of FIG. 1. As indicated, block 8 includes a Memory Storage Unit (MSU) 9, an Arithmetic Logic Unit (ALU) 10, Flip Flop and Register Storage 11, an Input/Output Section (I/O) 12, a Maintenance Processor (MP) 13, and Timing Control 14, each of which may be provided in any of a variety of well known forms presently available in the art.

Microinstruction memory 20 in FIG. 1 stores a plurality of randomly accessible microinstructions which, as is well known, are accessed in an order dependent on microinstruction flow. For example, note U.S. Pat. No. 4,179,737 and the references cited therein which disclose typical microprogrammed data processing systems. More specifically, in response to an address A provided by address register 18, a selected microinstruction M in microinstruction memory 20 is read out into a microinstruction register 22, and from there is applied to block 8 for execution. As shown in FIG. 1, the microinstruction M in microinstruction register 22 is also applied to a microinstruction error checker 25 which, in the specific embodiment being described, may simply be a parity bit checker which produces a true error output signal E when the microinstruction M applied thereto contains a parity error.

It will first be assumed that no microinstruction error is detected, in which case the output signal E will be false and microinstruction M in microinstruction register 22 will be executed by block 8 in the normal manner. Note that no delay is introduced by error checker 25 since microinstruction M is applied directly to block 8 without there being any need to wait for the results of the error checker 25. As is conventional, the results of microinstruction execution will be stored in flip-flops and registers storage 11 in block 8. As is also conventional, the execution of a microinstruction will result in block 8 applying condition and branching signals CB to microinstruction sequencer 28. The address A in address register 18 is also applied to microinstruction sequencer 28 via an add+1 circuit 29. Micro Sequencer 28 operates in a conventional manner in response to these inputs to apply a next microinstruction address to address register 18, following which the above described operation repeats for each subsequent next selected microinstruction, and so on, as long as no microinstruction error is detected by error checker 25.

Having described how microinstruction execution and sequencing occurs when no microinstruction error is detected by error checker 25, it will now be assumed that error checker 25 detects an error in a microinstruction M loaded into microinstruction register 22 from microinstruction memory 20. In such a case, error checker 25 produces a true error signal E which is applied to microinstruction register 22, to address register 18, and to the flip-flop and register storage 11 and maintenance processor 13 of block 8. The error signal E acts to "freeze" operations by freezing the current settings of microinstruction register 22 and address register 18, as well as the settings of other storage devices in block 8 (such as the flip-flops and registers 11) which could be affected by microinstruction execution, so as to thereby, in effect, abort execution of the microinstruction in microinstruction register 22. One way for accomplishing such microinstruction abortion is disclosed in the aforementioned U.S. Pat. No. 4,179,737.

The detection of a microinstruction error thus causes control of operations to be transferred to the maintenance processor 13 in block 8 in FIG. 1. In addition to receiving the true error signal E, the maintenance processor 13 also receives the microinstruction M which produced the error along with its address A from address register 18. As is conventional, the maintenance processor 13 has access to a correct copy of the microinstruction stored at each address in microinstruction memory 20. Accordingly, in response to a true error signal E and the microinstruction M and its address A, the maintenance processor 13 loads the correct microinstruction Mc into the microinstruction register 22, and restarts operations by unfreezing the frozen storage devices and causing the correct microinstruction Mc now in microinstruction register 22 to be applied to block 8 and error checker 25. This time error checker 25 does not detect an error, so that error signal E goes false, thereby permitting microinstruction execution and selection of the next microinstruction to occur in a normal manner as previously described.

Figure 2:
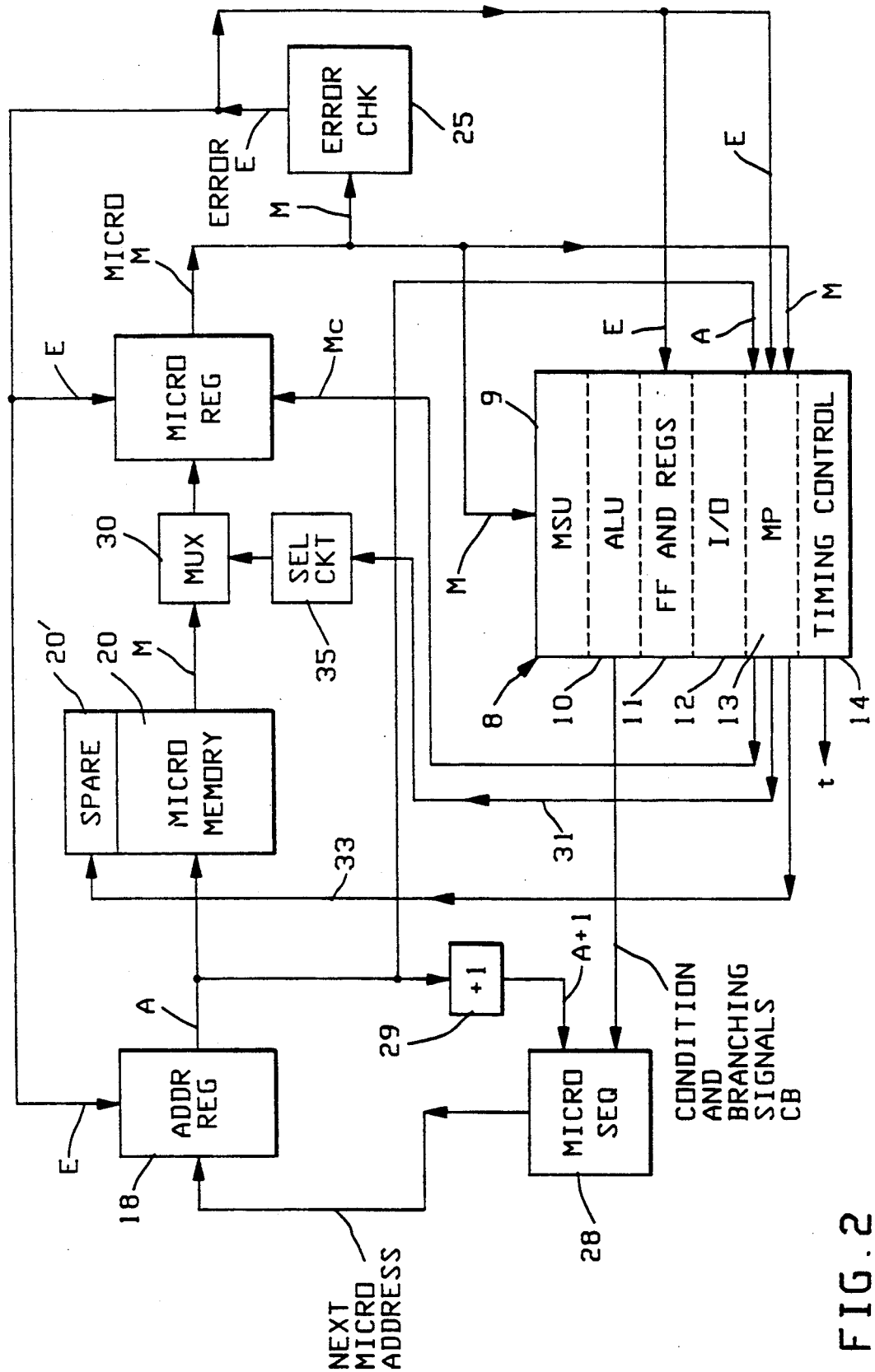
FIG. 2 is an electrical block diagram illustrating another embodiment of the invention.

Reference is next directed to FIG. 2 which illustrates another embodiment of the invention This embodiment additionally provides for distinguishing between hard and soft errors and also provides for substituting an alternate memory portion for a memory portion in the original microinstruction memory which is determined to have produced a hard error.

In the embodiment of FIG. 2, the maintenance processor 13 operates to determine the occurrence of a hard error by making a record of the memory location of each detected bit error. If a second error is later detected for the same bit of a microinstruction, the maintenance processor 13 assumes that the error in this bit is not a transient error, but a hard error. One way of handling such a hard error is to cause an error halt in system operation which would then require appropriate servicing. However, the embodiment of FIG. 2 advantageously makes provision for increasing the mean time between servicing by providing for substituting a corresponding bit from an additionally provided spare memory portion when a hard error in a bit of a microinstruction is detected, as will now be described.

It will be seen in FIG. 2 that an additional microinstruction memory portion 20' is provided along with the microinstruction memory 20. This microinstruction memory portion 20' may typically be provided, for example, by adding a spare bit column to memory 20 such that a spare bit is available for each microinstruction. Also provided is a multiplexer 30 and selection circuitry 35 coupled thereto which determines the manner in which the microinstruction bits read out from memory 20, 20' are applied to the microinstruction register 22.

Operation of the FIG. 2 embodiment is such that, when the maintenance 35 processor 13 determines that a detected error is a hard error, it operates via lines 31, to set selection circuitry 35 based on which memory column contains the bit which caused the hard error.

Also, the maintenance processor 13, via lines 33, loads the spare column 20' so that its bit values correspond to those in the column in which the hard error was detected, including providing a correct value for the corresponding bit which produced the hard error. In the preferred embodiment being described, these operations occur while microinstruction execution operations are "frozen" following detection of an error by error detector 25, and they are completed prior to the time that operations are restarted, at which time, the correct microinstruction Mc will also have been loaded into the microinstruction register 22, so as to thereby permit correct microinstruction execution to continue, as previously described in connection with FIG. 1.

As a result of the output selection circuitry 35 having been set by the maintenance processor 13 based on the memory column which produced the hard error, as described above, the multiplexer 30 is accordingly reconfigured such that, each time a microinstruction is subsequently accessed, the corresponding spare column bit is substituted for the one in the column which produced the hard error. For the particular embodiment illustrated in FIG. 2 in which only a single spare column is provided, the detection of a second hard error bit in the same column as the previously detected hard error is typically used to cause an error halt. If desired, additional spare memory columns could be provided to permit substitution for an additional number of hard errors occurring in different columns before an error halt occurs.

Although the description of the invention provided herein has been primarily directed to particular illustrative embodiments, it is to be understood that many modifications and variations in structure, arrangement, components, operation, and use are possible. The appended claims are accordingly intended to cover and embrace all such possible modifications and variations coming within the true spirit and scope of the invention.

What is claimed is:

1. In a data processing system, the combination comprising:

addressable microinstruction memory means for storing microinstructions;

execution means for executing a microinstuction applied thereto;

means for accessing a microinstruction from said microinstruction memory means;

means for applying an accessed microinstruction to said execution means;

microinstruction error detection means to which an accessed microinstruction is applied concurrently with the application of the accessed microinstruction to said execution means, said microinstruction error detection means being operative to abort execution of the accessed microinstruction when an error is detected therein; and microinstruction error correction means responsive to the detection of a microinstruction error by said error detection means for causing a correct microinstruction to be applied to said execution means, said microinstruction error correction means including means for detecting whether a detected microinstruction error is a hard error;

wherein said microinstruction memory means includes a microinstruction memory arranged in bit-storing columns and having at least one spare column of bits, wherein said means for accessing a microinstruction includes an address register for applying a microinstruction address to said microinstruction memory for producing microinstruction output bits including at least one output bit from said spare column of bits, wherein said means for applying an accessed microinstruction includes a microinstruction register for concurrently applying an accessed microinstruction to said execution means and to said microinstruction error correction means, wherein said microinstruction error correction means is operative in response to the detection of a hard error in a microinstruction memory column for storing correct data in a corresponding column of said additional microinstruction memory portion, wherein said microinstruction error correction means includes a multiplexer which determines the manner in which said microinstruction output bits are applied to said microinstruction register which in the absence of a hard error does not include an output bit from a spare column of said additional microinstruction memory portion, and wherein said microinstruction error correction means is operative in response to the detection of a hard error to reconfigure said multiplexer such that each time a microinstruction is subsequently addressed by said address register the output bit from said corresponding column is substituted for the column which produced the hard error.

2. In a data processing system, a combination comprising:
- a addressable microinstruction memory means for storing microinstructions, said memory means including a spare memory portion which is addressed concurrently therewith;
- execution means for executing a microinstruction applied thereto;
- means for accessing a microinstruction from said microinstruction memory means for providing a microinstruction output along with a spare memory portion output;
- means for applying an accessed microinstruction to said execution means, said means for applying including configurable multiplexer means for determining whether the output of said spare memory is to be substituted for a corresponding microinstruction portion;
- microinstruction error detection means to which an accessed microinstruction is applied concurrently with the application of the accessed microinstruction to said execution means, said microinstruction error detection means being operative to abort execution of the accessed microinstruction when an error is detected therein; and
- microinstruction error correction means responsive to the detection of a microinstruction error by said error detection means for causing a correct microinstruction to be applied to said execution means;
- said microinstruction error correction means also providing for detecting a hard error in a microinstruction and in response thereto loading said spare portion with corrective data and also configuring said multiplexer means so that when the microinstruction having the hard error is accessed corrective data from said spare portion is substituted for the microinstruction portion for which a hard error was detected.

3. In a data processing system, a combination comprising:
- a microinstruction memory arranged in bit-storing columns and having a spare bit column;
- execution means for executing a microinstruction applied thereto;
- addressing means for applying a microinstruction address to said microinstruction memory for accessing output bits therefrom, said output bits including microinstruction bits along with a bit from said spare bit column;
- configurable multiplexer means to which said output bits are applied;
- a microinstruction register coupled to said configurable multiplexer means for receiving and storing output bits therefrom constituting a microinstruction;
- selection means for selectively configuring said multiplexer means to substitute the bit from said spare bit column in place of a microinstruction bit,
- means for applying a microinstruction in said microinstruction register to said execution means;
- microinstruction error detection means to which a microinstruction is applied from said microinstruction register concurrently with the application of the microinstruction to said execution means, said microinstruction error detection means being operative to abort execution of the accessed microinstruction and also prevent accessing of a next microinstruction when an error is detected in an accessed microinstruction; and
- microinstruction error correction means responsive to the detection of a microinstruction error by said error detection means for causing a correct microinstruction to be applied to said execution means;
- said microinstruction error correction means providing for detecting a hard error in a microinstruction bit and in response thereto loading said spare bit column to correct the error, said microinstruction error correction means also signaling said selection means to reconfigure said multiplexer means so that when the microinstruction having the hard error is accessed the bit from said spare bit column is substituted for the microinstruction bit for which a hard error was detected.

4. The invention in accordance with claim 2 or 3, wherein said data processing means includes a plurality of storage means each having settings, wherein said microinstruction error detection means is operable to abort execution of a microinstruction in response to the detection of an error therein by freezing the settings of those storage means which could be affected by microinstruction execution, and wherein said microinstruction error correction means is operable to unfreeze the frozen storage means and cause a correct microinstruction to be applied to said microinstruction execution means.

5. The invention in accordance with claim 1, 2 or 3, wherein said microinstruction error correction means comprises a maintenance processor which has access to a correct copy of the microinstruction stored at each address in said microinstruction memory means, and wherein said error correction means receives the microinstruction memory address of a microinstruction for which an error is detected by said error detection means for use in providing a correct copy thereof.

6. The invention in accordance with claim 5, wherein a microinstruction register is provided for receiving a microinstruction accessed from said memory and from which microinstruction register an accessed microinstruction is applied to said execution means, wherein said microinstruction error detection means is coupled to said microinstruction register for receiving an accessed microinstruction, and wherein said microinstruction error detection means is coupled to said microinstruction register for loading a correct microinstruction therein.

7. The invention in accordance with claim 1, 2 or 3, wherein a hard error is detected by determining whether a particular type of error is detected for a particular microinstruction a predetermined number of times.

8. The invention in accordance with claim 1, 2 or 3, wherein said substitution is performed while operations are frozen in response to the detection of a hard microinstruction error.

9. The invention in accordance with claim 1, wherein said microinstruction error correction means includes selection means responsive to the detection of a hard error for reconfiguring said multiplexer.

10. In a data processing system having microinstruction execution means for performing data processing operations in response to microinstructions applied thereto, a method comprising the steps of:

providing a microinstruction memory arranged in bit-storing columns along with an additional microinstruction memory portion providing at least one spare column of bits;

providing an address register for storing a microinstruction address;

applying a microinstruction address in said address register to said microinstruction memory for producing microinstruction output bits including at least one output bit from said additional microinstruction memory portion;

selectively applying particular ones of said microinstruction output bits constituting a microinstruction to a microinstruction register;

applying a microinstruction in said microinstruction register to said execution means;

controlling said selectively applying such that in the absence of a hard error the microinstruction applied to said execution means does not include an output bit from a spare column of said additional microinstruction memory portion;

concurrently with said selectively applying, checking the microinstruction applied to said execution means to detect whether the microinstruction contains an error;

in response to detecting an error, aborting the execution of the microinstruction which produced the error;

detecting a hard error by determining whether a detected error was previously detected a predetermined number of times; and in response to detecting a hard error, storing correct data in a corresponding column of said additional microinstruction memory portion while also modifying the step of controlling such that each time a microinstruction is subsequently addressed by said address register the microinstruction output bits applied to said microinstruction register contains the output bit from said corresponding column substituted for the one in the column which produced the hard error.

* * * * *